(12) United States Patent
Schnuerer et al.

(10) Patent No.: US 8,218,336 B2
(45) Date of Patent: Jul. 10, 2012

(54) ELECTRICAL MODULE

(75) Inventors: Marco Schnuerer, Pforzheim (DE);
Stefan Ballweg, Karlsruhe (DE)

(73) Assignee: Wilhelm Sihn jr. GmbH & Co. KG,
Niefern-Oeschelbronn (DE)

( * ) Notice: Subject to any disclaimer, the term of this patent is extended or adjusted under 35 U.S.C. 154(b) by 268 days.

(21) Appl. No.: 12/730,084

(22) Filed: Mar. 23, 2010

(65) Prior Publication Data

US 2010/0265669 A1  Oct. 21, 2010

(30) Foreign Application Priority Data

Apr. 16, 2009 (DE) .................. 10 2009 017 926

(51) Int. Cl.
*H05K 7/02* (2006.01)
*H05K 7/04* (2006.01)
(52) U.S. Cl. ..................... 361/807; 361/810
(58) Field of Classification Search .......... 361/807, 361/810, 801–803, 825, 747; 174/138 E, 174/138 G
See application file for complete search history.

(56) References Cited

U.S. PATENT DOCUMENTS

| | | | |
|---|---|---|---|
| 6,677,526 B2 * | 1/2004 | Kishizawa | 174/68.1 |
| 6,724,637 B2 * | 4/2004 | Li et al. | 361/760 |
| 6,875,053 B2 * | 4/2005 | Fujii et al. | 439/567 |
| 6,954,354 B2 * | 10/2005 | Shyr | 361/679.33 |
| 6,954,940 B2 * | 10/2005 | Hsu | 720/639 |
| 7,821,793 B2 * | 10/2010 | Yin | 361/747 |
| 2007/0090266 A1 * | 4/2007 | Hsu | 248/500 |

FOREIGN PATENT DOCUMENTS

DE   103 06 783 A1   10/2004

\* cited by examiner

*Primary Examiner* — Hung S Bui

(57) ABSTRACT

The present invention relates to an electrical module for a system processing motor vehicle aerial signals, comprising a housing in which an electrical circuit is arranged and plug-in connectors that are provided on the housing and are connected to the circuit, wherein the module comprises on an end a spring strap for engaging in an opening of a carrier part of a vehicle and on an opposite end a fastening device with spreading elements.

15 Claims, 4 Drawing Sheets

US 8,218,336 B2

ELECTRICAL MODULE

The present invention relates to an electrical module for a system designed for processing motor vehicle aerial signals, having a housing in which an electrical circuit is arranged and plug-in connectors that are provided on the housing and are connected to a circuit.

Motor vehicles normally use an aerial module that is mounted on the roof, and a system for processing aerial signals that is connected to the module, i.e. a system for processing signals received from, or to be transmitted by, the aerial module. Such a system normally comprises a receiver, for example for radio or GPS signals, and sometimes also a transmitter.

Electrical modules for such systems, designed for processing motor vehicle aerial signals, comprise an electrical circuit, for example in the form of a separating filter, an amplifier, a block circuit and/or an impedance converter. Such modules normally are mounted inside the vehicle, on a suitable carrier part, such as a cross-tie, a stiffening frame of the chassis, or a cross member.

It has been known in the art to fasten such assemblies on a carrier part of the motor vehicle by a screw connection.

Now, it is the object of the present invention to show a way how to reduce the effort of mounting an electrical module of the described type in a motor vehicle.

That object is achieved by an electrical module having the features defined in claim 1. Advantageous further developments of the invention are the subject-matter of sub-claims.

A module according to the invention comprises a spring strap, intended to be engaged in a mounting opening of a carrier part of a motor vehicle, on its one end and, on an opposite end, a fastening device with spreading elements. Preferably the module is mounted on a carrier part provided with a first mounting opening for the spring strap and with another mounting opening for the fastening device. However, there is also the possibility to mount the module on a carrier part provided with a single, correspondingly bigger mounting opening in which both the spring strap and the fastening device can be engaged.

The fastening device anchors the module on the carrier part due to the fact that the spreading elements spread once they have been engaged in the mounting opening provided for this purpose. The spreading elements may be designed to move resiliently so that they can be compressed as they pass the mounting opening, and will then spread again automatically.

It is an advantage of the module according to the invention that it can be easily mounted in a motor vehicle by sliding the spring strap below the edge of a mounting opening and is then subjected to a bending stress by a turning movement that causes the fastening device to enter another or the same mounting opening provided for that purpose. In the mounted condition, the spring strap engages the carrier part resiliently from below, thereby preventing any clattering of the module.

An advantageous further development of the invention provides that the fastening device comprises a clamping element, for example a screw. The clamping element can be operated to pull the spreading elements against the carrier part so that the supporting element will be clamped between the bottom of the module and the spreading elements. In this way, the module can be held on the carrier part more effectively, and any clattering can be prevented more efficiently. Advantageously, a clamping element may also be used to balance out different thicknesses of the carrier part. For example, the carrier part may be made from sheet steel having a thickness of 0.5 mm to 2 mm so that the desired adaptation and clatter-free mounting can be achieved simply by tightening the clamping element as necessary. Preferably, the clamping element is held on a support, for example a sheet-steel strip fixed on the housing of the module, in a defined position.

Another advantageous further development of the invention provides that the module comprises a sheet-steel strip that forms the spring strap on its one end and carries the clamping device on its other end. That feature provides the advantage that the mounting spots of the module, formed by the spring strap and the fastening device, can be connected one with the other in a mechanically sturdy fashion by simple means. Clamping forces exerted by the spring strap and the fastening device can be reliable absorbed and the housing of the module can be safely supported in this way. The sheet-steel strip may form the bottom of the housing. But it is also that the sheet-steel strip extends through the housing of the module in which case the latter can be produced at low cost from a plastic material. It is preferred in that case to provide the clamping element with a head that is resiliently pressed against the support.

The support may be provided with a hole through which the clamping element is passed. However, there is also the possibility to provide the support with a slot which is open on one side and which receives a narrow portion of the clamping element.

BRIEF DESCRIPTION OF THE DRAWINGS

Further details and advantages of the invention will be described hereafter with reference to certain embodiments and to the attached drawings. Identical or similar parts are identified in the drawings by identical reference numerals. In the drawings.

DETAILED DESCRIPTION

Figure 1:
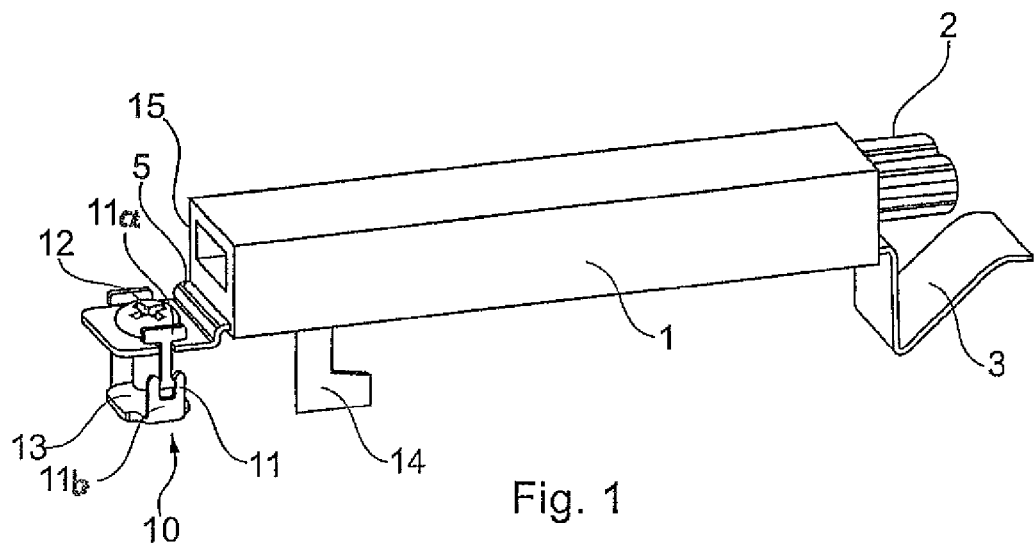
FIG. 1 shows one embodiment of a module according to the invention.
Figure 2:
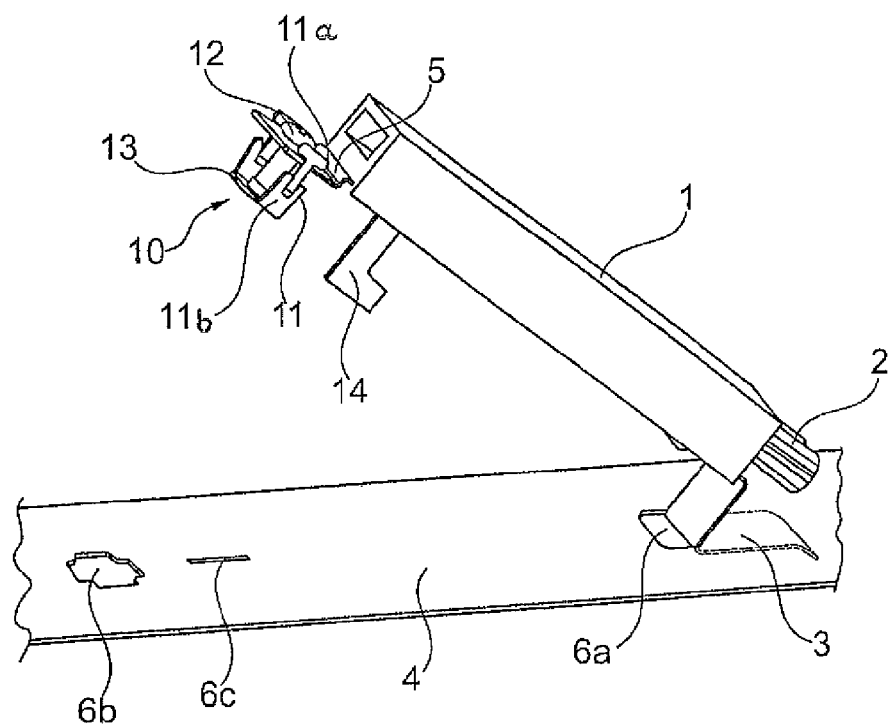
FIG. 2 shows a mounting step for fixing the module on a supporting element.
Figure 3:
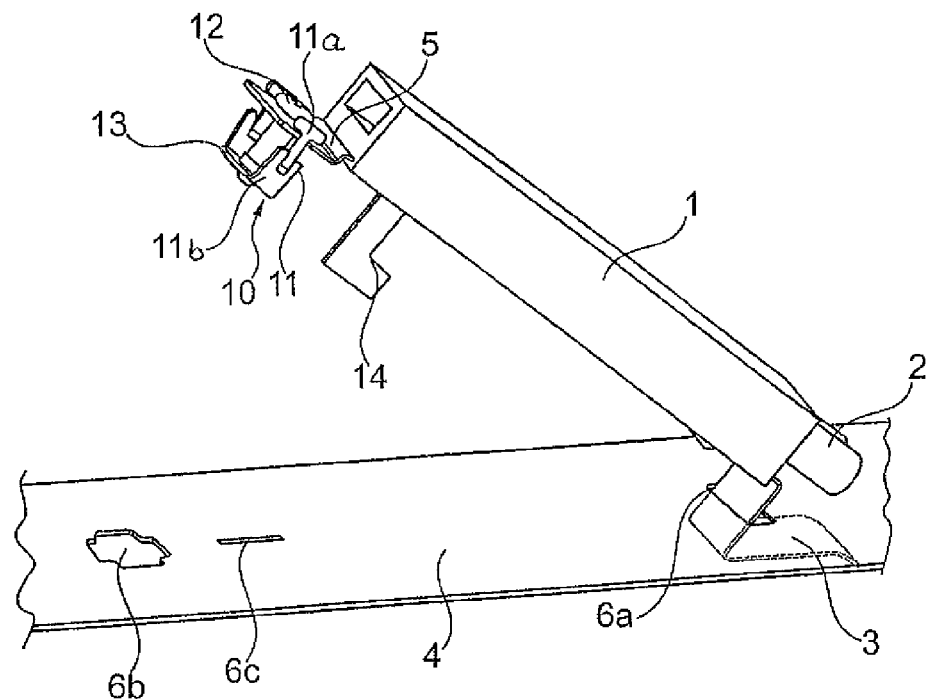
FIG. 3 shows another mounting step.
Figure 4:
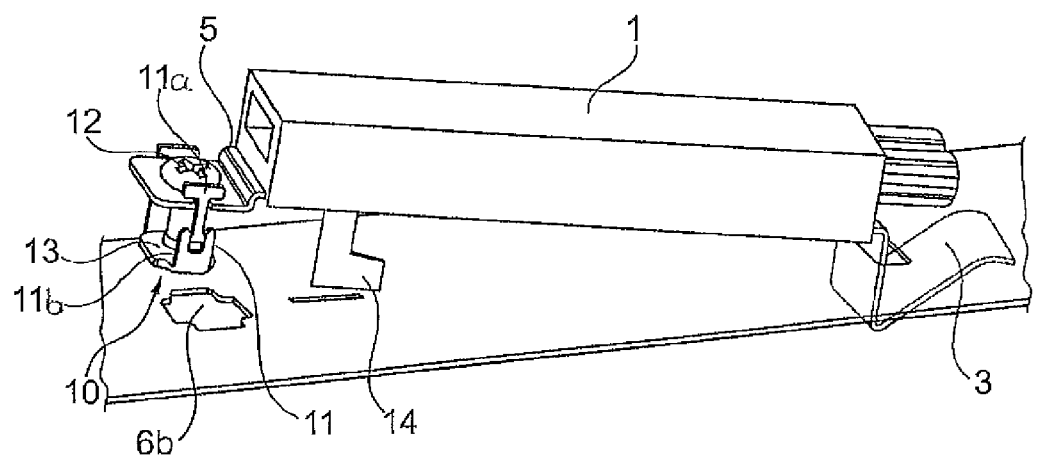
FIG. 4 shows another mounting step.
Figure 5:
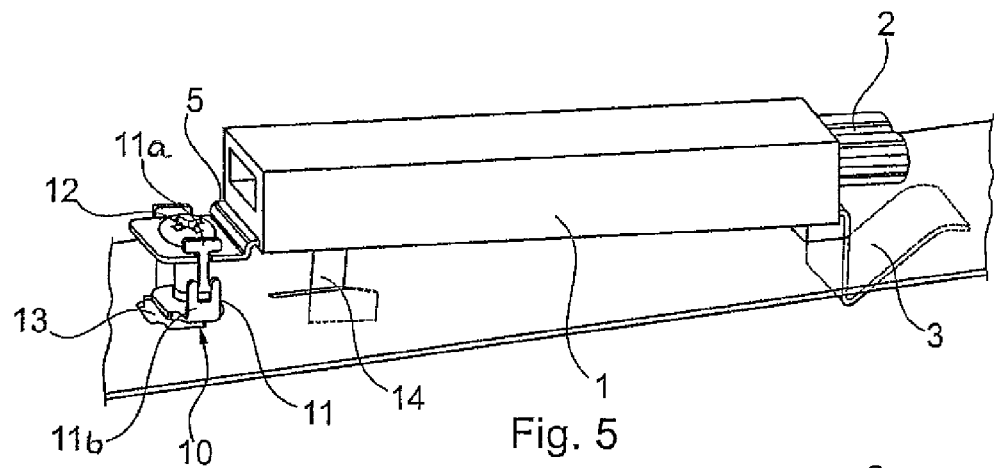
FIG. 5 shows another mounting step.
Figure 6:
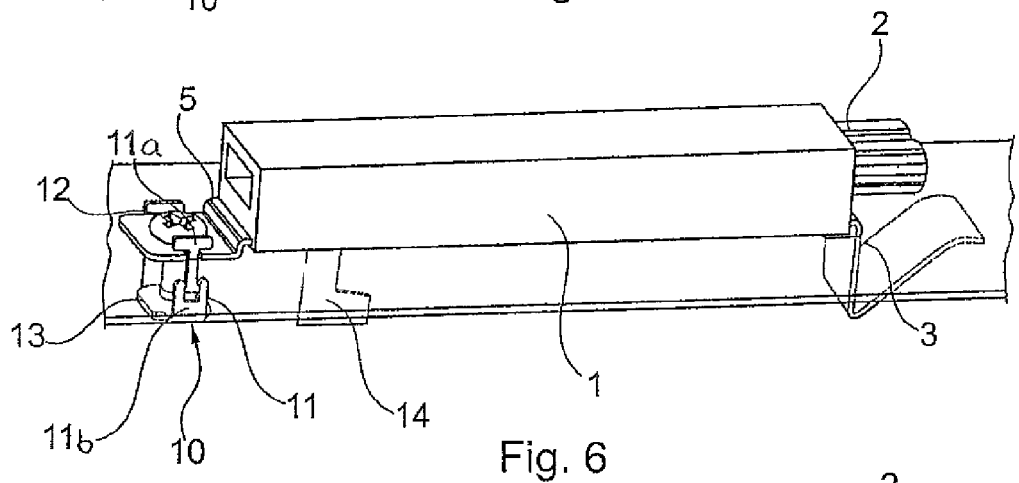
FIG. 6 shows another mounting step.

FIGS. 1 to 7 show an embodiment of an electrical module for a system designed for processing motor vehicle aerial signals. The module may be arranged, for example, between the vehicle aerial assembly and a transmitter and/or a receiver.

The module has an oblong, preferably a cuboid, housing 1. Arranged in the housing 1 is a circuit, not shown, for example an impedance converter, a separating filter, an amplifier and/or a block circuit. Plug-in connectors 2, connected to the circuit, are provided on a side of the housing 1. These connectors permit the module to be connected to the cable system of a motor vehicle. In the illustrated example, only two such plug-in connectors are provided. If necessary, however, a module may also comprise a greater number of plug-in connectors 2.

Preferably, at least some of the plug-in connectors 2 are coaxial plug-in connectors. But the module may also comprise other plug-in connectors, especially one or more multi-pole plug-in connectors, which likewise may be arranged on one of the side walls of the housing 1. The housing of the illustrated embodiment has an opening 15 provided for such a plug-in connector.

Preferably, the plug-in connectors 2 are arranged on one end of the housing 1, just as in the illustrated embodiment. This allows the scarce mounting space available in vehicles to be utilized in the best possible way. As in the illustrated embodiment, a plurality of plug-in connectors 2 may be arranged on one end in this case. But there is also the possibility to arrange plug-in connectors 2 on opposite ends of the housing 1.

The module is provided, on its one end, with a spring strap 3 that can be fitted in a mounting opening 6a of a earlier part 4 of the motor vehicle and, on another end, with a fastening device 10 with spreading elements 11. As can be seen in FIGS. 2 to 7, for mounting the module one initially introduces the spring strap 3 into a mounting opening 6a provided for that purpose in the carrier part 4, and one then introduces the fastening device 10 into the mounting opening 6b provided for that purpose by turning the module correspondingly. That movement subjects the spring strap 3 to a bending stress. In order to improve the springiness and to facilitate the mounting process, the spring strap 3 may be provided with a kink or a bend, as shown in the Figures.

Preferably, the module comprises a sheet-steel strip 5 that forms the spring strap 3 on its one end and that carries the fastening device 10 on its other end. That arrangement provides the advantage of giving the module and its mounting system high mechanical stability. Moreover, the sheet-steel strip 5 can be used as a mass contact for the circuit contained in the housing 1.

The fastening device 10 preferably comprises a clamping element 12, for example in the form of a screw. Tightening of the screw then allows the spreading elements 11 to be pulled against the bottom of the carrier part 4 so that the latter can be clamped between the support and the fastening device 10, in the illustrated embodiment the sheet-steel strip 5, and the spreading element 11.

In the simplest case, the spreading elements 11 may be designed as straight spring supports. Preferably, however, the spreading elements 11 comprise an upper part 11a and a lower part 11b that enclose between them an obtuse angle that gets smaller as the element spreads. In the illustrated embodiment, the spreading elements 11 are designed in the way of a knee or elbow joint and spread when the respective joints are inflected. Actuation of the clamping elements 12, i.e. tightening of the screw, pulls the spreading elements 11 in upward direction so that the angle between the upper part 11a and the lower part 11b of the spreading elements 11 is correspondingly reduced, thereby causing the elements to spread.

Figure 7:
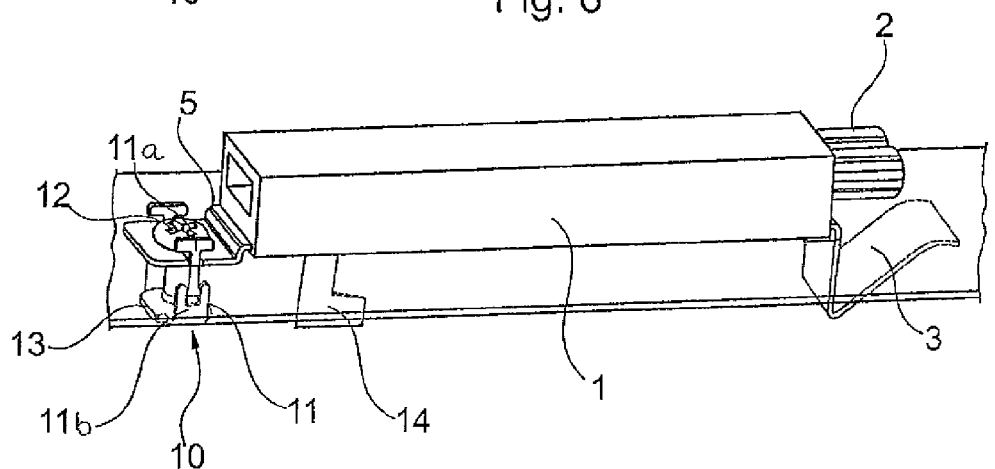
FIG. 7 shows the module mounted on the carrier part.

As can be seen best in FIG. 7, the upper part 11a of the spreading elements 11 projects beyond the mounting opening 6b in the mounted condition, as viewed from the housing 1. That feature provides the advantage that the illustrated module can be removed later, if desired. When untightening the clamping element 12, the upper parts 11a of the spreading elements 11, projecting from the mounting opening 6b, can be compressed and the fastening device 10 can then be lifted off the mounting opening 6b.

Preferably, the upper parts 11a of the spreading elements 11 and the support of the fastening device 10, i.e. the sheet-steel strip 5 in the illustrated embodiment, stick mechanically one in the other thereby securing the fastening device 10 on the module and preventing the fastening device 10 from getting detached from the module prior to or during the mounting process. The upper parts 11a may be given a T shape for this purpose, for example. The upper parts 11a advantageously rest against the upper part of the mounting opening 6b of the carrier part 4 in the mounted condition, thereby defining the maximum spread. In addition, it is possible in this way to prevent the fastening device 10 from getting detached from the support 5 if the system should be removed later.

In the illustrated embodiment, the spreading elements 11, i.e. their lower parts 11b, are provided with points. As the clamping element 12 is tightened, these upwardly directed points get into contact with the carrier part 4 on which the module is to be mounted. Accordingly, the spreading elements 11 can be used to improve the mass-contacting conditions for the circuit contained in the housing 1.

The spreading elements 11 may extend from a base part 13 which is connected with the clamping element 12 by a screw connection in the illustrated embodiment. The spreading elements 11 and the base part 13 can be produced at low cost as a single sheet-steel element made by punching and bending.

Preferably, the clamping element 12 is held on the support 5 in a defined position. It is ensured in this way that the head of the clamping element cannot be lifted off the support 5 during module. For example, the fastening device 10 may be provided for this purpose with spring elements that act upon the support. Suitable spring elements may be designed, for example, as brackets that project from the base part 13. The carrier part 4 can then be resiliently urged against the head of the clamping element 12.

In the illustrated embodiment, the clamping element 12 is held on the support 5 in a defined position by an arrangement where the support 5 comprises a slot which is open on one side and in which the clamping element 12 is fitted (not shown). The clamping element has a narrow portion by which it fits into the slot in the support 5. However, being wider on both sides of that narrow portion, the clamping element 12 is fixed in the support 5 in axial direction.

In order to reduce the risk of faulty installation the module may be provided on its bottom with a mechanical coding element 14. The module then can be mounted exclusively on carrier parts of motor vehicles that have an opening 6c that matches the coding element 14. In the illustrated embodiment, the coding element 14 is disk or plate-shaped so that, correspondingly, the carrier part 4 is provided with a coding slot. In principle, however, the mechanical coding element 14 may have any desired shape and may also be formed as a stud, for example. Preferably, the coding element 14 is L-shaped. That feature provides the advantage that the coding element 14 can engage a suitably sized slot 6c in the carrier part 4 only in one clearly defined position. However, after engagement the component can be displaced in lengthwise direction of the housing 1.

Figure 8:
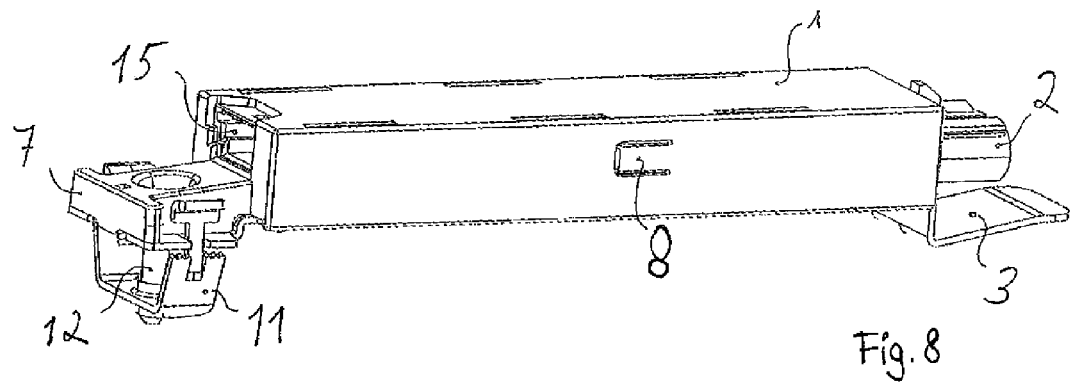
FIG. 8 shows another embodiment of a module according to the invention.
Figure 9:
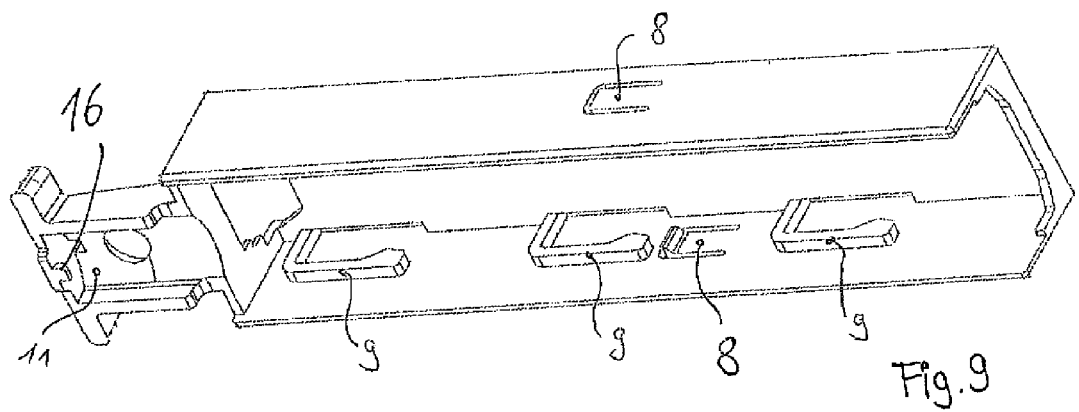
FIG. 9 shows the housing of the module illustrated in FIG. 8.

The embodiment illustrated in FIGS. 8 and 9 essentially differs from the one described above only by the design of the housing 1. The housing 1 comprises in this case, on its end facing the spreading elements 11, an extension 7 covering the support 5 of the spreading elements 11. The extension 7 of the housing comprises an opening for the clamping element 12 and holds the clamping element 12 undetachably. And the extension 7 of the housing also acts as a centering aid for a tool used for tightening the clamping element 12.

The extension 7 of the housing acts as a finger protection when mounting the illustrated module. Preferably, the upside of the extension 7 of the housing projects beyond the spreading elements 11 before the latter are introduced into a mounting opening and before they are spread.

As can be seen in the view of the housing 1 illustrated in FIG. 9, the housing 1 comprises resilient locating hooks 8 and clamping ribs 9 on its inside. The locating hooks 8 and the clamping ribs 9 serve to hold a circuit inside the housing. This advantageously facilitates the module process of the module according to the invention. The housing may be additionally provided with one or more locating lugs 16 that hold the support 5. In the illustrated embodiment, one such locating lug 16 is arranged on the bottom of the extension 7 of the housing.

LIST OF REFERENCE NUMERALS

1 Housing
2 Plug-in connector
3 Spring strap
4 Supporting element
5 Sheet-steel strip
6a, 6b, 6c Mounting opening
7 Extension of the housing
8 Locating hook
9 Clamping ribs
10 Fastening device
11 Spreading element
11a Upper part of the spreading element
11b Lower part of the spreading element
12 Clamping element
13 Base part
14 Coding element
15 Opening
16 Locating lug

What is claimed is:

1. Electrical module for a system processing motor vehicle aerial signals, comprising
    a housing and
    plug-in connectors that are provided on the housing, wherein
    the module comprises on an end a spring strap for engaging in an opening of a carrier part of a vehicle and on an opposite end a fastening device with spreading elements, said fastening device comprising a clamping element.

2. The module as defined in claim 1, wherein the spreading elements are springy.

3. The module as defined in claim 1, wherein the spreading elements are provided with points.

4. The module as defined in claim 1, wherein the module comprises a support which forms the spring strap on one end and carries the fastening device on its other end.

5. The module as defined in claim 4, wherein the support is a strip of sheet-steel.

6. The module as defined in claim 1, wherein for mounting the module the spring strap is slid below an edge of an opening of a carrier part of a vehicle and is then subjected to a bending stress in a turning movement to achieve engagement of the clamping device.

7. The module as defined in claim 1, wherein the housing is elongate and at least one of the plug-in connectors is arranged on an end of the housing.

8. The module as defined claim 1, wherein at least one of the plug-in connectors is a coaxial plug-in connector.

9. The module as defined in claim 1, wherein a mechanical coding element is provided on the bottom of the housing.

10. The module as defined in claim 1, wherein the spreading elements project from a base part which is connected with the clamping element by a screw connection.

11. Electrical module for a system processing motor vehicle aerial signals, comprising
    a housing and
    plug-in connectors that are provided on the housing, wherein
    the module comprises on an end a spring strap for engaging in an opening of a carrier part of a vehicle and on an opposite end a fastening device with spreading elements, spreading elements forming a ground contact for the electric circuit.

12. Electrical module for a system processing motor vehicle aerial signals, comprising
    a housing and
    plug-in connectors that are provided on the housing, wherein
    the module comprises on an end a spring strap for engaging in an opening of a carrier part of a vehicle and on an opposite end a fastening device with spreading elements, the spreading elements comprising an upper part and a lower part which enclose between them an obtuse angle that gets smaller as the element spreads.

13. The module as defined in claim 12, wherein in its mounted condition the upper part projects beyond the mounting opening of the carrier part in which the fastening device is received.

14. The module as defined in claim 12, wherein the upper part of the fastening device is caught in the support.

15. The module as defined in claim 12, wherein the lower parts of the spreading elements are provided with upwardly directed points.

* * * * *